(12) United States Patent
Hu

(10) Patent No.: US 8,424,748 B2
(45) Date of Patent: Apr. 23, 2013

(54) SOLDER IN CAVITY INTERCONNECTION TECHNOLOGY

(75) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 12/643,084

(22) Filed: Dec. 21, 2009

(65) Prior Publication Data

US 2011/0147440 A1   Jun. 23, 2011

(51) Int. Cl.
  *H01L 21/44*   (2006.01)
  *B23K 31/02*   (2006.01)

(52) U.S. Cl.
  USPC ............ 228/180.22; 228/180.21; 228/256; 438/612; 438/613; 257/737; 257/780

(58) Field of Classification Search ............ 228/180.21, 228/180.22, 256; 257/737, 780; 438/106, 438/612, 613
  See application file for complete search history.

(56) References Cited

U.S. PATENT DOCUMENTS

| 5,146,674 | A | * | 9/1992 | Frankeny et al. | 29/830 |
| 5,586,715 | A | * | 12/1996 | Schwiebert et al. | 228/248.1 |
| 5,658,827 | A | * | 8/1997 | Aulicino et al. | 228/180.22 |
| 5,889,326 | A | | 3/1999 | Tanaka | |
| 5,977,632 | A | | 11/1999 | Beddingfield | |
| 6,320,254 | B1 | | 11/2001 | Liou et al. | |
| 6,583,517 | B1 | * | 6/2003 | Jimarez | 257/781 |
| 6,622,907 | B2 | * | 9/2003 | Fanti et al. | 228/215 |
| 6,921,860 | B2 | * | 7/2005 | Peterson et al. | 174/523 |
| 2003/0009878 | A1 | * | 1/2003 | Gregory | 29/840 |
| 2005/0215044 | A1 | * | 9/2005 | Huang | 438/614 |
| 2007/0269973 | A1 | * | 11/2007 | Nalla et al. | 438/612 |
| 2008/0023829 | A1 | | 1/2008 | Kok et al. | |
| 2008/0157353 | A1 | | 7/2008 | Watanabe et al. | |
| 2009/0218688 | A1 | | 9/2009 | Ayotte et al. | |
| 2010/0000775 | A1 | * | 1/2010 | Shen et al. | 174/260 |
| 2012/0241965 | A1 | | 9/2012 | Hu et al. | |

FOREIGN PATENT DOCUMENTS

| EP | 1022774 A2 | 7/2000 |
| JP | 8-023147 A | 1/1996 |
| JP | 2000-216194 A | 8/2000 |
| WO | 2012129153 A2 | 9/2012 |

OTHER PUBLICATIONS

Tobias Baumgartner et al., Printing Solder Paste in Dry Film—A Low Cost Fine-Pitch Bumping Technique, 2007 9th Electronics Packaging Technology Conference, 2007 IEEE, pp. 609-612.
Office Action Received for Korean Patent Application No. 10-2010-130907, Mailed on Feb. 10, 2012, 10 pages of Office Action including 5 pages of English Translation.
Office Action Received for Korean Patent Application No. 10-2010-130907, mailed on Sep. 27, 2012, 9 Pages of Office including 4 pages of English translation.
International Search Report and Written Opinion received for PCT application No. PCT/US2012/029617, mailed on Oct. 29, 2012, 11 pages.

* cited by examiner

*Primary Examiner* — Devang R Patel
(74) *Attorney, Agent, or Firm* — Winkle, PLLC

(57) ABSTRACT

An interconnection technology may use molded solder to define solder balls. A mask layer may be patterned to form cavities and solder paste deposited in the cavities. Upon heating, solder balls are formed. The cavity is defined by spaced walls to keep the solder ball from bridging during a bonding process. In some embodiments, the solder bumps connected to the solder balls may have facing surfaces which are larger than the facing surfaces of the solder ball.

19 Claims, 4 Drawing Sheets

US 8,424,748 B2

SOLDER IN CAVITY INTERCONNECTION TECHNOLOGY

BACKGROUND

This relates generally to integrated circuit interconnection technologies.

Integrated circuit interconnection technologies connect two electronic components, both mechanically and electrically. For example, solder balls may be used to connect an integrated circuit to a printed circuit board, such as a motherboard. The integrated circuit is placed over the motherboard with intervening solder balls. Upon the application of heat, in a process called reflow, the solder is softened and a solder joint is formed between the devices.

While this type of surface mount or C4 connection has been highly successful, there is a continuing desire to increase the density of interconnections that can be formed. The more interconnections per unit of area that can be formed, the smaller the resulting devices can be. Generally, the smaller the devices, the lower their cost and the higher their performance.

Moreover, existing devices may be prone to a number of failures, including stress or fatigue related failures between the solder balls and other components, such as delamination of low dielectric constant dielectric under the solder joints. Other failures include bridging failures, wherein the solder from one connection bridges over to an adjacent connection.

DETAILED DESCRIPTION

In accordance with some embodiments, an interconnection technology may use intervening inter-cavity walls between solder bumps to maintain separation between soldered interconnections. In some cases, these walls can reduce bridging or cracking failures of the solder connections. In addition, in some cases, the reliability of the connections may be improved.

In some embodiments, instead of depositing solder balls, solder may be molded in place in cavities on a component to be joined to another component. Then the solder balls may be formed in place within the cavities. As a result, in some embodiments, the inter-cavity walls may supply separation between adjacent solder joints, reducing bridging, and permitting smaller interconnection pitch in some embodiments. In addition, the intervening walls may be used to strengthen or support the solder joints, particularly in response to lateral loading.

Figure 1:
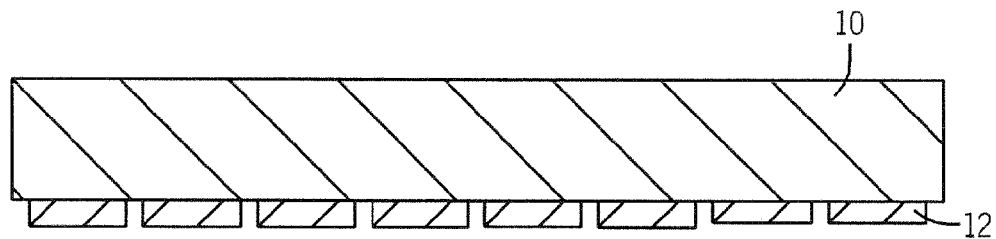
FIG. 1 is an enlarged, cross-sectional view of one embodiment at an early stage.

In accordance with one embodiment, shown in FIG. 1, a substrate 10 may have a plurality of metallic lands or bumps 12 formed thereon. The substrate 10 may be any component suitable for joining integrated components, including an integrated circuit wafer, a die, a printed circuit board, or even a packaged integrated circuit. In some embodiments, the bumps 12 may be formed of copper.

In some cases, the bumps 12 may be larger than conventional bumps. The larger bumps can be used to reduce stress in the bump to solder ball connection. It is advantageous for the bump to be bigger than the ball, in some cases, but typically a solder ball is larger than its underlying bump.

Stress is coupled through a smaller area, in some embodiments of the present invention, through the bigger bump, reducing stress under the bump in some cases. Thus, it is advantageous, in some embodiments, to make the bump larger than the facing surface of the resulting solder ball.

Figure 2:
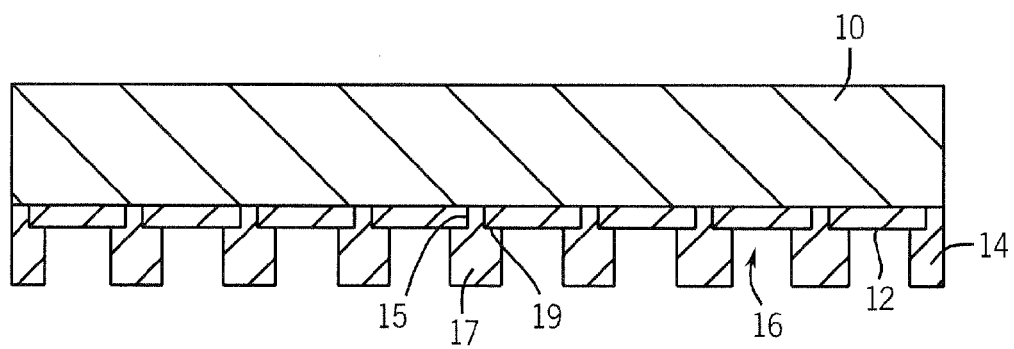
FIG. 2 is an enlarged, cross-sectional view at a subsequent stage where a coating has been applied and patterned in accordance with one embodiment.

Referring to FIG. 2, a mask layer 14, such as photoresist, may be coated and patterned. As a result of the patterning, cavities 16 are formed over each of the bumps 12. In addition, an intervening inter-cavity wall 17 is formed between cavities 16. The walls 17 amount to the residual remainder of the etched mask layer 14. Note that, in some embodiments, the wall 17 may be T-shaped, having a portion 15 extending between adjacent bumps 12 and a portion extending thereover between adjacent cavities 16. As a result, a portion 19 of the wall 17 actually overlies an end portion of a bump 12.

Figure 3:
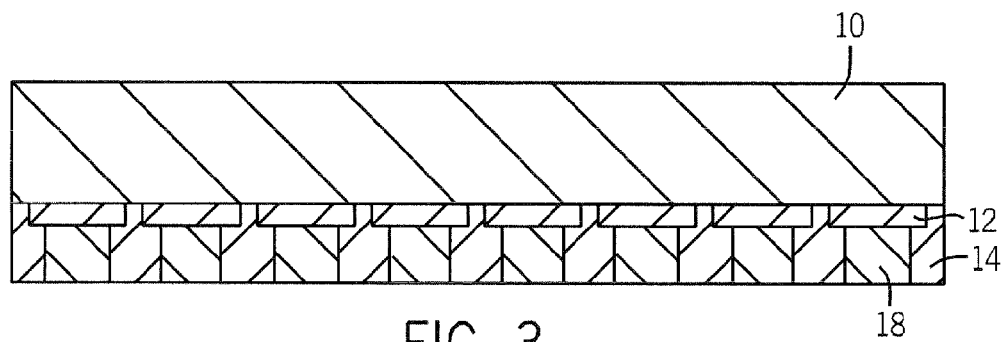
FIG. 3 is an enlarged, cross-sectional view at a subsequent stage involving solder paste printing in accordance with one embodiment.

Then, as shown in FIG. 3, the structure of FIG. 2, including its cavities 16, acts as an effective mold for the printing of solder paste 18. The solder paste 18 is deposited within the cavities 16.

In some embodiments, the solder is solder paste with relatively small sized micro-balls of solder powder in a flux matrix. In some embodiments, the solder powder has a diameter that is one-seventh or less of the smallest feature size, which is typically the cavity 16 thickness or depth.

Figure 4:
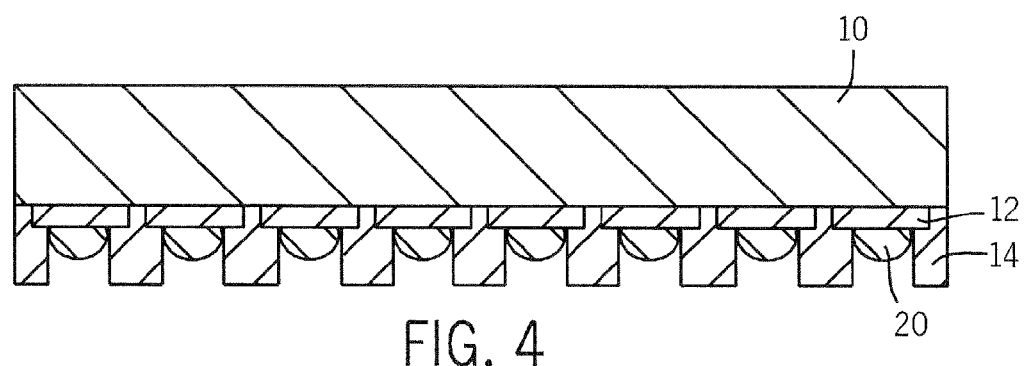
FIG. 4 is an enlarged, cross-sectional view at a subsequent stage involving solder reflow in accordance with one embodiment.

Then, referring to FIG. 4, solder is reflowed, causing the printed solder 18 to take on the shape of a curved structure or solder ball with a flattened surface adjacent to the bump 12. It should also be observed that the volume of the solder ball 20 is smaller than that of the deposited paste 18. One reason for this is the volatilization of the flux matrix. The curved shape of the solder ball 20 is a function of the surface energy or wetting angle of the solder material on the layer 14.

Figure 5:
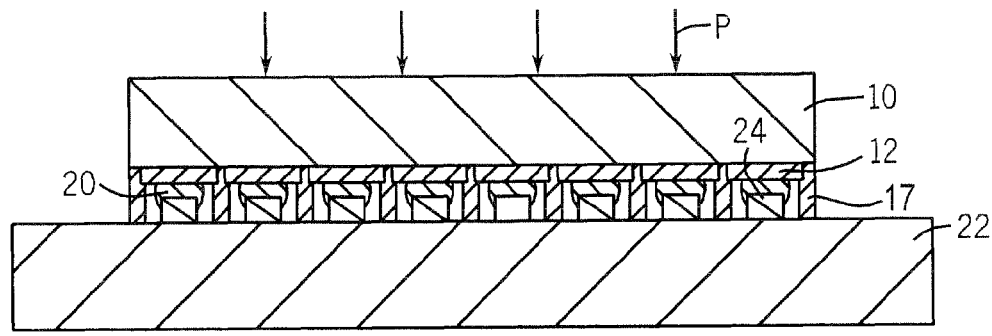
FIG. 5 is an enlarged, cross-sectional view at a subsequent stage showing the interconnection between two components in accordance with one embodiment.

Turning to FIG. 5, the substrate 10, shown in FIG. 4, may then engage the structure 22. The structure 22 may be an integrated circuit chip, an integrated circuit wafer, a substrate, or a printed circuit board, to mention a few examples. The structure 22 may have upstanding lands 24, each sized to fit within a cavity 16 and to engage a solder ball 20 therein.

In some embodiments, the upstanding lands 24 engage and penetrate the solder balls 20, forming a strong connection. In effect, the connection is three dimensional. Compared to conventional solder ball connection techniques, the interconnected surface area is greater than that of conventional surface mounts, resulting in a much stronger connection in some embodiments. In some embodiments, a pressure P in excess of the weight of the substrate 10 is applied to produce this inter-engagement and penetration of the solder ball 20 by the land 24.

Figure 6:
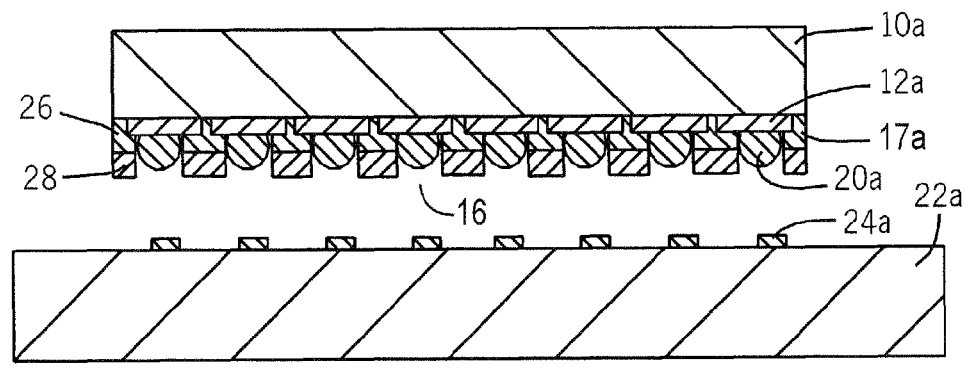
FIG. 6 is an enlarged, cross-sectional view of another embodiment.

In accordance with another embodiment, the wall 17 may be replaced with a two layer wall 17a, shown in FIG. 6, made up of the stacked portions 26 and 28. The inner portion 26 may be formed of one material and the outer portion 28 may be formed of a separate material, such that the material 28 may be removed, while leaving the material 26. For example, the material 28 may be removed by etchants that do not substantially affect the material 26 in some embodiments.

As a result of removing the layer 28 if desired, the solder balls 20a, which were formed entirely within the cavities 16, may protrude out of the reduced cavities defined by only the inner layer 26. The protrusion of the balls 20a may be advantageous in some embodiments. In one embodiment, the structure 22a may have lands 24a that may be less tall than the lands 24 of FIG. 5.

Figure 7:
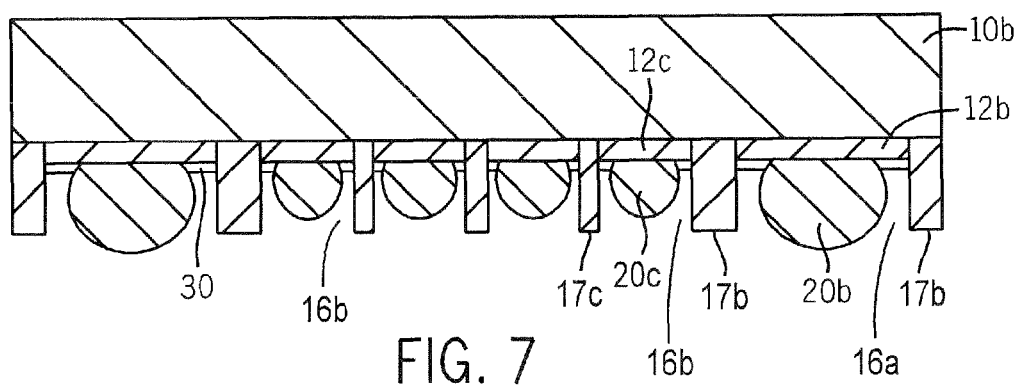
FIG. 7 is an enlarged, cross-sectional view of still another embodiment.

Referring to FIG. 7, in accordance with still another embodiment, the cavities 16a and 16b may be of different sizes. As a result, the solder balls 20b and 20c may be of different sizes. This ball size difference may be advantageous in making electrical and mechanical connections to components that are irregularly shaped. In effect, the cavities can be sized to create balls having a collective configuration that matches the configuration of another structure. In some embodiments, gaps G may be maintained between the walls 17b and 17c and the intervening solder balls 20c or 20b. In some embodiments, the gap G may be a 20 micron gap between the wall 17 and the solder ball.

In addition, a layer 30 may be deposited to define a keep out zone to confine a solder ball to a particular central region over the bump 12b or 12c. The layer 30 may be a material that is not readily wetted by the liquid solder.

Figure 8:
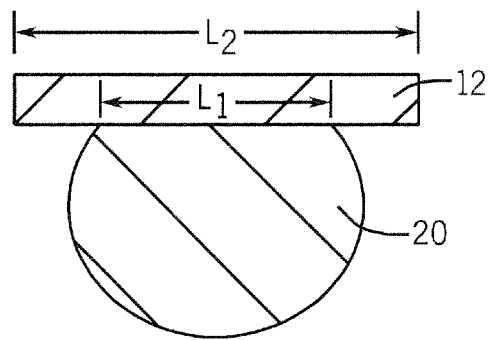
FIG. 8 is an enlarged depiction of a solder ball and land in accordance with one embodiment.

Referring next to FIG. 8, in some embodiments, it is advantageous that the length L2 of the bump 12 is substantially larger than the length L1 of the facing surface of the solder ball 20. To give more specific examples, it may be advantageous to have a conventional interconnection pitch of 200 microns in some embodiments. But with such a pitch, it is advantageous that the bumps have a much larger size than conventional bumps, for example, on the order of 180 microns, compared to conventional bumps (for a 200 micron pitch) that would conventionally have 100 micron size. At the same time, the solder balls 20 may have a 160 micron dimension L1, which is smaller than the bump size L2. In contrast, conventional solder balls in such technologies would be larger than the bumps and may be on the order of 130 to 140 microns.

As a result, in some embodiments, the bumps and the solder balls are bigger for the same pitch. The larger solder bump size results in a more reliable connection in some embodiments. In particular, in some embodiments, the solder ball dimension is at least 75 percent of the pitch. In some embodiments, the bump size is at least 70 percent of the pitch and the bump is larger than the solder. In some embodiments, advantageous configurations are possible because of the physical barrier between adjacent connections provided by the wall 17 that restrains and separates the solder.

Figure 9:
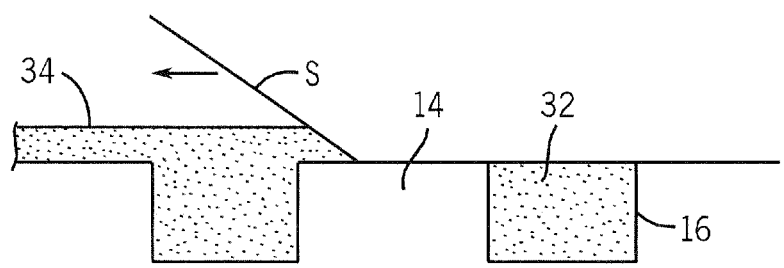
FIG. 9 is an enlarged, cross-sectional view showing one embodiment for the application of solder paste.

Referring to FIG. 9, one technique for depositing the solder paste 32 in the cavities 16 is to use a squeegee printing using a squeegee S. The squeegee printing deposits the solder neatly into the cavity 16 by moving a portion of solder paste 34 across the cavity 16 ahead of the squeegee. However, other techniques may also be used to print or deposit the solder paste into the cavity 16.

Figure 10:
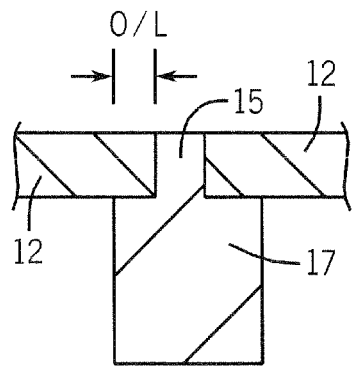
FIG. 10 is an enlarged, cross-sectional view of one embodiment of an inter-cavity wall.

Referring to FIG. 10, in some embodiments, the wall 17 overlaps, by the distance indicated by "O/L," the bumps 12. Having the walls overlap the edge of the bumps keeps the solder size from getting as big as the bump and reduces stress in some embodiments. It may be advantageous, in some embodiments, that the solder does not wet to the edge of the bump for reliability reasons and, particularly, for stress reduction. Thus, in some embodiments, it is also advantageous to use a material to form the layer 14 that adheres to the material used for the bumps 12, which is typically copper. A larger bump thickness is also better, too, since it spreads the heat from integrated circuits.

In some embodiments, the walls 17 are much taller than the final bump size. For example, the walls 17 may be 50 to 100 microns taller than the bump in some cases. This height difference may be achieved with a 200 to 250 micron cavity 16 depth or thickness.

In accordance with some embodiments, instead of using conventional photoresist, a dry film may be used to define the cavity. In some cases, the dry film cavity may be wider than the solder balls.

In some embodiments, the solder bumps may be relatively elongate or more oval than circular. In other words, the aspect ratio of the bumps may be much larger than that depicted. In addition, the bumps may be made by the composite of two different solders. In some embodiments, the land on the structure 22 may be much smaller than the bump on the substrate 10. As a result, the solder may take on a frustroconical shape, instead of the more circular shape depicted, upon bonding. In some cases, underfill may be applied between the frustroconical solder bonds.

In some embodiments, the solder balls may extend beyond the walls and, in other embodiments, they may extend to the wall height and, in still other embodiments, the solder balls may have a height less than the height of the walls. The different heights of the solder balls may be accommodated through different heights of the lands on the structure 22, for example.

Figure 11:
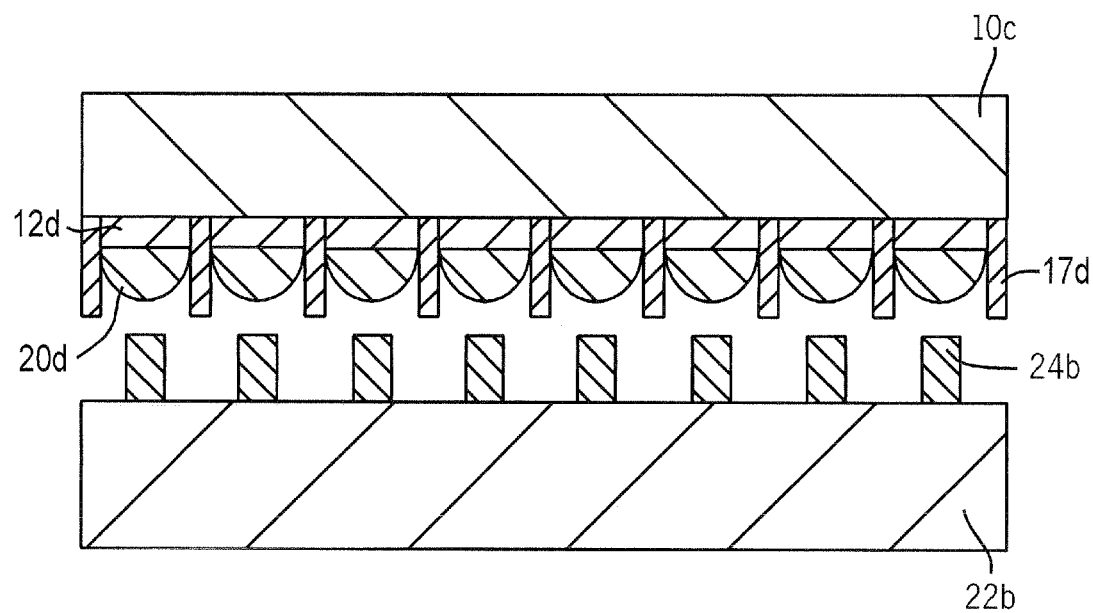
FIG. 11 is an enlarged, cross-sectional view of yet another embodiment.

Referring to FIG. 11, in accordance with yet another embodiment, a substrate 10c may be secured to a structure 22b, having protrusions 24b. The substrate 10c may have a wall 17d formed before the formation of said solder bump 12d via plating, paste printing or other methods. The solder balls 20d are formed using the same wall 17d and thus have a diameter that substantially equals the diameter of the solder bumps 12d. The solder bumps 12d may be either a copper or a solder material with a columnar or spherical shape, for example.

In some cases, the embodiment of FIG. 11 may be formed with solder that is a paste printed using the same photoresist used to plate the bumps 12d. A seed layer (not shown) may be stripped after reflow of the solder.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a first component with two adjacent solder balls secured to two adjacent solder bumps, respectively;

forming a wall to overlap an edge portion of each of the two adjacent solder bumps, wherein the wall forms two adjacent cavities such that the solder balls are entirely contained within the cavities, and wherein the wall is formed of at least two stacked layers of uniform width and extends beyond the solder bumps;

aligning a second component including two adjacent lands to connect to said first component solder balls, wherein said lands extend into said first component cavities; and reflowing said solder balls to solder said solder balls to said lands.

2. The method of claim 1 including making the solder balls by molding a solder paste in the cavities.

3. The method of claim 2 including forming the cavity from an outwardly extending wall and maintaining said wall to protect the solder ball between two adjacent portions of said wall.

4. The method of claim 3 including forming said wall of a patterned deposited layer.

5. The method of claim 4 including forming said layer of photoresist.

6. The method of claim 4 including forming said layer of dry film.

7. The method of claim 2 including forming said paste of a powder having a diameter less than or equal to one-seventh of a depth of the cavity.

8. The method of claim 1 including forming the solder ball having a dimension that is at least 75 percent of an interconnection pitch.

9. The method of claim 1 including forming the solder bump that is at least 70 percent of an interconnection pitch.

10. The method of claim 2 including forming cavities of different sizes.

11. The method of claim 1 including forming said bump bumps on a die.

12. The method of claim 1 including forming said bumps on a substrate.

13. The method of claim 1 including forming said wall of stacked outer and inner layers such that the outer layer may be removed without removing the inner layer.

14. The method of claim 1 including forming the solder balls taller than said inner layer.

15. The method of claim 2 including squeegee printing solder paste into said cavities.

16. The method of claim 15 including reflowing the solder paste to form a solder balls that wet the solder bumps.

17. The method of claim 1 including forming a material on said solder bumps to limit wetting of solder.

18. The method of claim 1 including applying pressure so that said land lands penetrate into said solder balls.

19. The method of claim 1 including causing said lands to extend into said cavities.

* * * * *

UNITED STATES PATENT AND TRADEMARK OFFICE
CERTIFICATE OF CORRECTION

| | |
|---|---|
| PATENT NO. | : 8,424,748 B2 |
| APPLICATION NO. | : 12/643084 |
| DATED | : April 23, 2013 |
| INVENTOR(S) | : Chuan Hu |

Page 1 of 1

It is certified that error appears in the above-identified patent and that said Letters Patent is hereby corrected as shown below:

In the Claims:

In column 6, line 10-11, in claim 11, delete "bump bumps" and insert -- bumps --, therefor.

In column 6, line 26, in claim 18, delete "land lands" and insert -- lands --, therefor.

Signed and Sealed this
Second Day of July, 2013

Teresa Stanek Rea
*Acting Director of the United States Patent and Trademark Office*